(12) United States Patent
Okandan et al.

(10) Patent No.: US 9,536,947 B1
(45) Date of Patent: Jan. 3, 2017

(54) SILICON NANOWIRE DEVICE AND METHOD FOR ITS MANUFACTURE

(71) Applicant: Sandia Corporation, Albuquerque, NM (US)

(72) Inventors: Murat Okandan, Edgewood, NM (US); Bruce L. Draper, Albuquerque, NM (US); Paul J. Resnick, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 13/966,553

(22) Filed: Aug. 14, 2013

Related U.S. Application Data

(60) Provisional application No. 61/684,085, filed on Aug. 16, 2012, provisional application No. 61/769,030, filed on Feb. 25, 2013.

(51) Int. Cl.
H01L 29/06 (2006.01)
H01L 21/306 (2006.01)
H01L 29/08 (2006.01)
H01L 29/78 (2006.01)
H01L 29/423 (2006.01)
H01L 29/10 (2006.01)

(52) U.S. Cl.
CPC ......... H01L 29/0669 (2013.01); H01L 21/306 (2013.01); H01L 29/0673 (2013.01); H01L 29/0847 (2013.01); H01L 29/1037 (2013.01); H01L 29/42376 (2013.01); H01L 29/42392 (2013.01); H01L 29/7853 (2013.01)

(58) Field of Classification Search
None
See application file for complete search history.

(56) References Cited

U.S. PATENT DOCUMENTS

| 8,368,125 | B2* | 2/2013 | Chidambarrao | B82Y 10/00 257/255 |
|---|---|---|---|---|
| 2003/0089899 | A1* | 5/2003 | Lieber et al. | 257/9 |
| 2004/0166642 | A1* | 8/2004 | Chen et al. | 438/284 |
| 2007/0262344 | A1* | 11/2007 | Anwar | B82Y 10/00 257/157 |
| 2008/0006883 | A1* | 1/2008 | Mori | 257/379 |
| 2009/0072223 | A1* | 3/2009 | Awano | B82Y 10/00 257/24 |
| 2010/0193770 | A1* | 8/2010 | Bangsaruntip | B82Y 10/00 257/24 |
| 2011/0133163 | A1* | 6/2011 | Bangsaruntip | B82Y 10/00 257/24 |
| 2011/0278544 | A1* | 11/2011 | Bangsaruntip | B82Y 10/00 257/24 |

(Continued)

OTHER PUBLICATIONS

Draper and Okandan, "Radiation Response of a Gate-All-Around Silicon Nano-Wire Transistor," IEEE Trans Nuc Sci, 56(6), Dec. 2009.

(Continued)

*Primary Examiner* — Andres Munoz
(74) *Attorney, Agent, or Firm* — Martin I. Finston

(57) ABSTRACT

There is provided an electronic device and a method for its manufacture. The device comprises an elongate silicon nanowire less than 0.5 μm in cross-sectional dimensions and having a hexagonal cross-sectional shape due to annealing-induced energy relaxation.

4 Claims, 11 Drawing Sheets

(56) References Cited

U.S. PATENT DOCUMENTS

2012/0007051 A1* 1/2012 Bangsaruntip ......... B82Y 10/00
257/24
2014/0151705 A1* 6/2014 Xiao ...................... B82Y 10/00
257/64

OTHER PUBLICATIONS

Okandan, M., "Neuro-inspired Computational Engines: Beyond Stored Program Architecture and Moore's Law Limits: Workshop Goals," Neuro-Inspired Computational Elements Workshop, Feb. 12, 2013, Albuquerque, NM.
Okandan, M., "Neuro-inspired Computational Engines: Beyond Stored Program Architecture and Moore's Law Limits," Neuro-Inspired Computational Elements Workshop, Feb. 25-27, 2013, Albuquerque, NM.
Okandan, M., "Neuro-inspired Computational Engines: Beyond Stored Program Architecture and Moore's Law Limits," DARPA pre-BAA, Jun. 26-27, 2013.
Okandan. M., "Neuro-inspired Computational Engines: Beyond Stored Program Architecture and Moore's Law Limits," International Workshop on Brain-Inspired Computing, Cetraro, Italy, Jul. 8-11, 2013.
Ziaei-Moayyed and Okandan, "CMOS-Compatible Gate-All-Around Silicon Nanowire detector," Sensors, 2011 IEEE, Conf. Date Oct. 28-31, 2011.
Ziaei-Moayyed et al., "Gate-All-Around Single-Crystalline Silicon Nanowire Optical Sensor," Tranducers'11, China, Jun. 5-9, 2011.

* cited by examiner

SILICON NANOWIRE DEVICE AND METHOD FOR ITS MANUFACTURE

CROSS-REFERENCE TO RELATED APPLICATIONS

This application claims priority under the provisions of 35 U.S.C. §119(e) to U.S. Provisional Application No. 61/684,085 filed on Aug. 16, 2012 and to U.S. Provisional Application No. 61/769,030, filed on Feb. 25, 2013.

NOTICE OF GOVERNMENT RIGHTS

This invention was developed under Contract DE-AC04-94AL85000 between Sandia Corporation and the U.S. Department of Energy. The U.S. Government has certain rights in this invention.

FIELD OF THE INVENTION

This invention relates to the microfabrication of silicon nanowires and to devices and structures that comprise silicon nanowires.

ART BACKGROUND

Devices based on silicon nanowires have been of recent interest because of novel, and potentially useful, effects associated with their very small size scale as well as the possibility of thermally and mechanically isolating the nanowire structures. For example, gate all-around silicon nanowire transistors have been considered for applications in chemical sensors, optical sensors, various suspended mechanical and thermal elements, and circuit elements exhibiting unusual quantum effects.

Silicon nanowire devices have been produced by various techniques of the prior art, including techniques based on etching with potassium hydroxide, techniques using gold-based or iron-based catalysts, and the growth and surface-dispersal of individual nanowires. However, most of those techniques preclude the possibility of integration with conventional CMOS processes. For example, when potassium hydroxide is used, it is prohibitively difficult to avoid potassium contamination of the silicon substrates, which renders them unusable for CMOS applications.

However, the integration of silicon nanowires on CMOS platforms is very desirable, not least because it offers the possibility of compact and cost-effective packaging of complete electronic hardware systems whose components include nanowire-based sensors.

Hence, there remains a need for CMOS-compatible methods of fabricating silicon nanowires.

SUMMARY OF THE INVENTION

We expect that the devices and processes disclosed here will be useful not only for are intended for supporting conventional device scaling, but also for enabling new device types, sensors and computational architectures. For example, nanowire-based suspension structures have potential applications for providing ultra-low noise performance in sensors such as seismometers, gravimeters and other inertial sensors.

We have developed a new fabrication process that includes generating an initial silicon wire and repeatedly oxidizing and reducing its size to generate a continuous silicon nanowire while it is still attached to other unaltered silicon regions. Since initial device position is defined by lithography, nanowires can be placed in precisely specified locations and standard CMOS doped regions can be defined for source and drain contacts. The wire cross-sectional dimension and shape are further modified by high temperature annealing to generate a hexagonal, energy minimized configuration.

The process steps are front-end CMOS compatible. Moreover, further CMOS processing can be done after the nanowire devices are completed, or processing steps can be interleaved to generate other CMOS devices.

DETAILED DESCRIPTION

In an exemplary sequence of steps for fabricating the silicon nanowire, an SOI substrate is prepared by deposition of a buried oxide layer followed by a device silicon layer of, e.g., about 250 nm thickness. The device silicon layer is patterned by deep UV lithography and etched by reactive ion etching (RIE) to define fine structures including the precursor of the nanowire and at each end, an anchor for the nanowire.

The device is then masked with silicon nitride and etched with a buffered oxide etchant to remove the buried oxide from under the nanowire.

Typical initial dimensions for the silicon nanowire are typically in the range 300-500 nm, and an exemplary nanowire is initially about 0.35 µm wide and about 0.3 µm thick. In particular, the initial width and thickness of the silicon nanowire will generally be no more than 0.5 µm.

Figure 1:
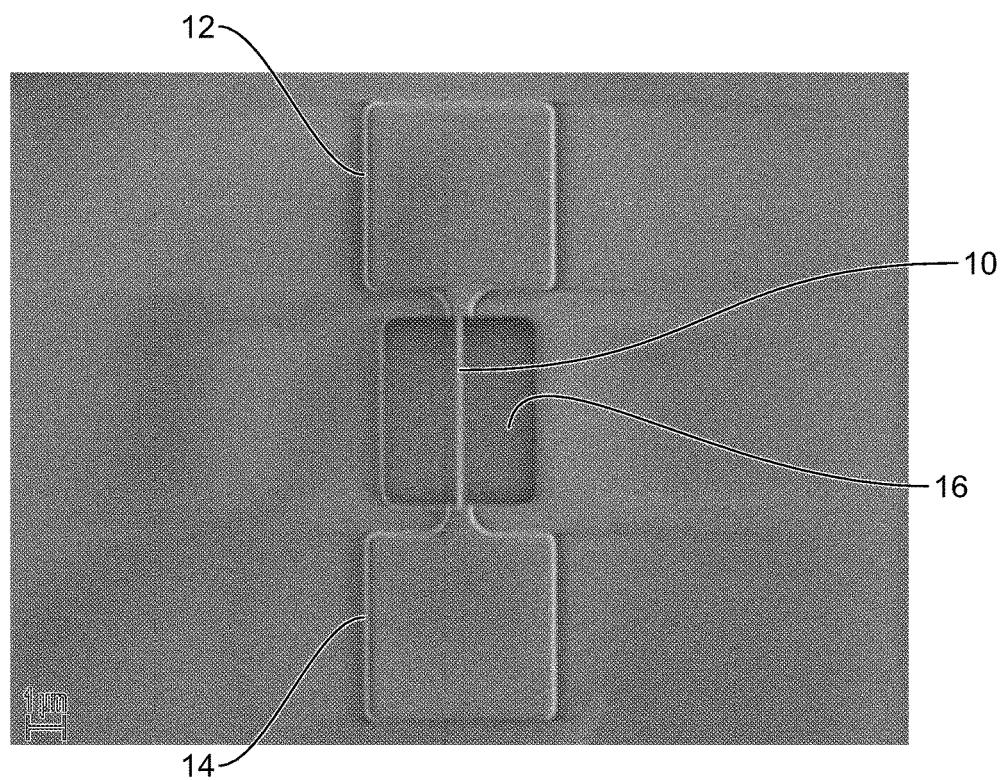
FIG. 1 is a scanning electron microscope (SEM) image of a partially completed nanowire transistor.

FIG. 1 is an image of a partially completed nanowire transistor, in which the nanowire 10, which has been released from the substrate as described below, is clearly visible. Also seen in the image are the source 12 and drain 14 regions for the transistor. As seen in the figure, the nanowire region extends between the source and drain. The void 16 under the nanowire, which leaves the nanowire as a suspended feature, is also clearly visible in the figure.

It will often be desirable to fabricate the nanowire to a very thin cross section, for example 50 nm or less in both transverse dimensions. Such fine dimensions are below the resolutions generally achievable purely by conventional lithographic techniques. Therefore, we have developed a special procedure for reducing the transverse dimensions of the (lithographically defined) nanowire.

Our technique is a sequence of oxidation steps to controllably consume silicon from the outer surface of the nanowire, each oxidation step being followed by an etching step to remove the newly formed oxide from the nanowire. The oxidize-etch sequence is performed one or more times, until the final dimensions are achieved. We believe that by this process, we can make a silicon nanowire as small as 5 nm in the transverse dimensions. The process is self-limiting, because eventually the silicon surface energy will inhibit further oxidation. The nanowire as shown in FIG. 1, for example, has undergone the oxidize/etch process.

Figure 2:
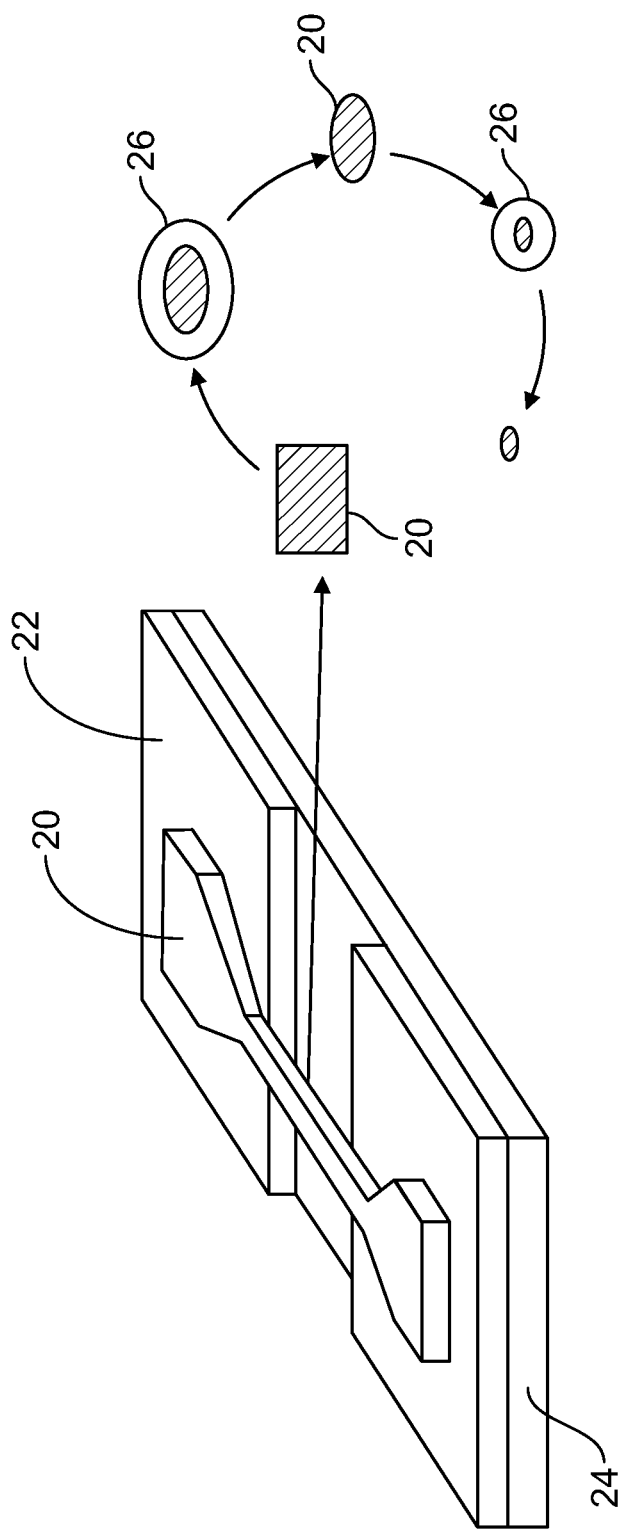
FIG. 2 provides a simplified sketch of a silicon nanowire transistor and on the right-hand side of the figure, a symbolic sketch of a process for thinning the nanowire by oxidization and etching.

In the simplified sketch of FIG. 2, for example, silicon nanowire 20 is shown suspended above buried oxide layer 22 and silicon wafer 24. As seen in the sequence of steps represented to the right of the sketch, successive oxidized layers 26 are etched away to expose successive thinned stages of nanowire 20.

In each oxidation step, an oxide depth of 60 nm is typically produced. We found that the oxidation steps can be performed successfully, e.g., in steam at 860 C, or alternatively in dry oxygen at 1100 C. The oxide is stripped in the etching step using, e.g., a buffered oxide etchant. Following the step of stripping the oxide, a new iteration of the oxidize-etch cycle can be initiated if it is determined that further size reduction is possible.

Although considerable variation is possible, exemplary reduced dimensions for the nanowire are 32.5 nm by 42 nm by 2 μm length. Lengths of 5 μm, and even of 10 μm or more, are believed achievable. As shown by this example, it will in particular be feasible to make a nanowire that, after size reduction, is less than 50 nm in cross sectional dimensions.

Figure 3:
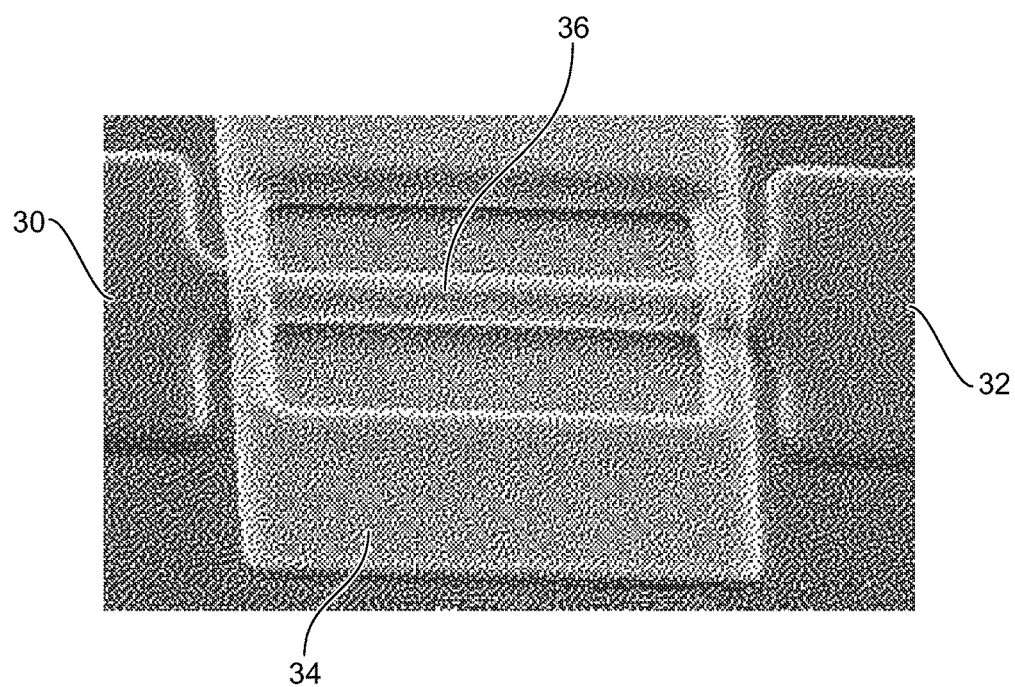
FIG. 3 provides an SEM image of a completed silicon nanowire transistor.

To complete the fabrication of a gate-all-around MOSFET, a final gate oxide, exemplarily 75-125 Å thick, may be deposited all around the nanowire after the final dimensions of the nanowire have been reached, followed by polysilicon deposition. Standard CMOS processing can be used to pattern the polysilicon gates, create heavily doped source and drain regions, deposit interlevel dielectric (as a high-density plasma oxide), form tungsten-filled contact openings, and deposit Al—Cu metallization. FIG. 3 provides a view of a completed silicon nanowire transistor including source 30, drain 32, polysilicon gate 34, and wrap-around gate oxide 36, which envelopes the silicon nanowire.

We found that a high-temperature anneal of the nanowire structure can relax strain in the nanowire through the redistribution and epitaxial regrowth of mobilized silicon atoms. One consequence is that the nanowire cross-sectional dimension and shape are further modified by the anneal to generate a hexagonal, energy minimized configuration. Such an anneal for relaxation of strain is advantageous if, for example, it is desired to grow an epitaxial layer of germanium or III-V material on the nanowire surface.

We obtained best results with a high-temperature anneal in forming gas, exemplarily for 30 minutes at 1050 C.

Figure 4:
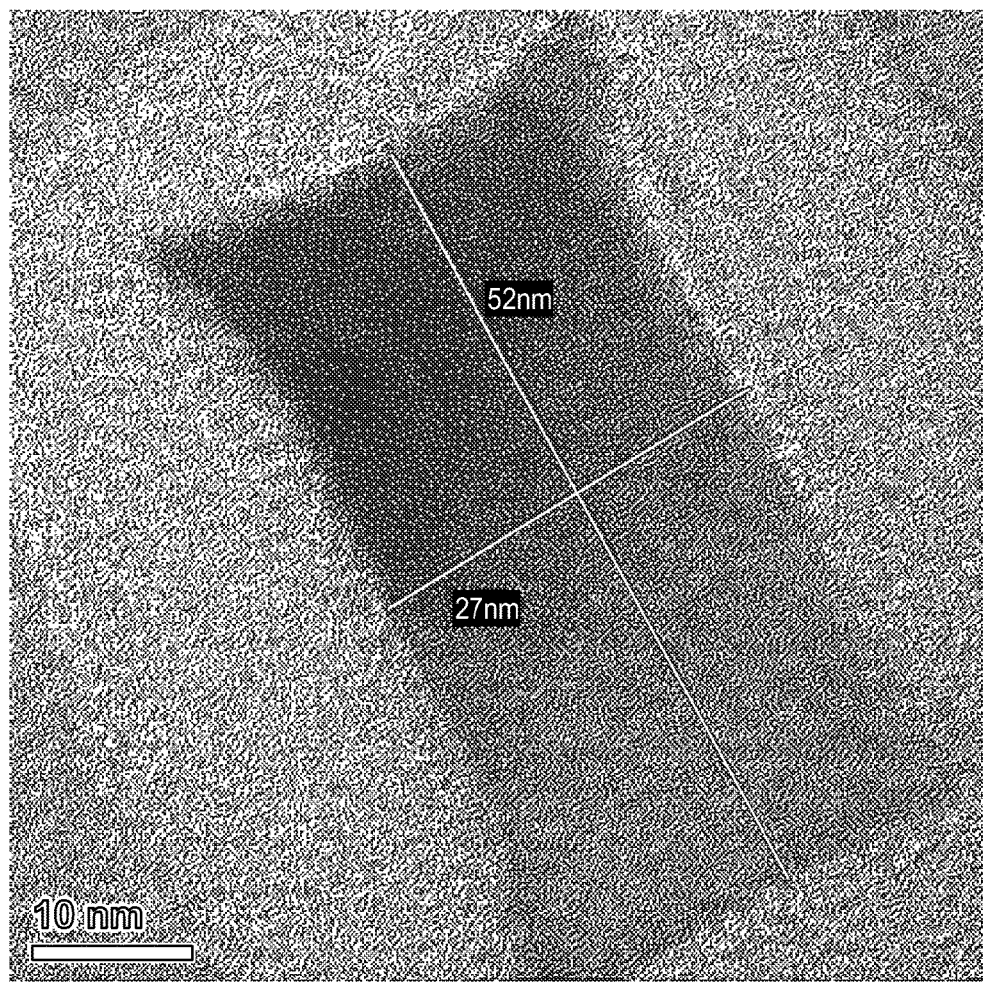
FIGS. 4 and 5 provide transmission electron microscope (TEM) cross-sectional images of typical nanowires before (FIG. 4) and after (FIG. 5) a high temperature anneal.
Figure 5:
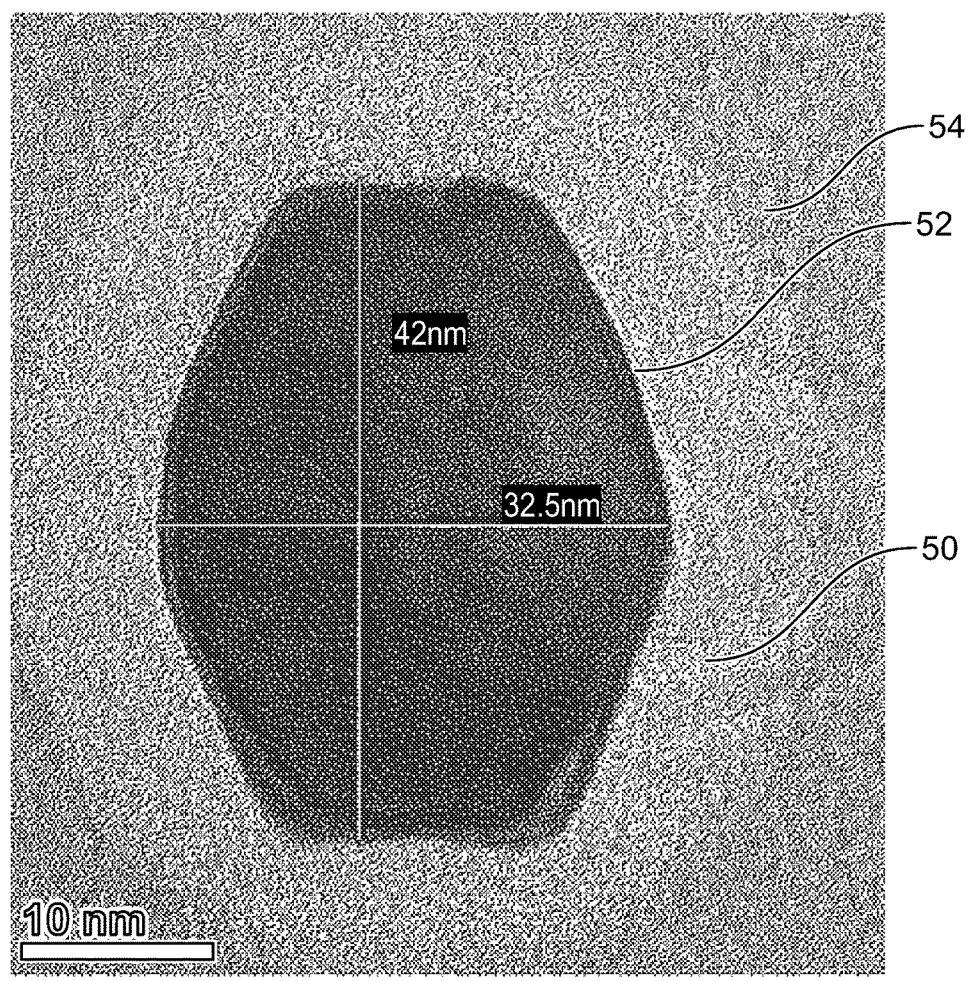

FIGS. 4 and 5 provide cross-sectional transmission electron microscope (TEM) images of typical nanowires before (FIG. 4) and after (FIG. 5) a high temperature anneal. Comparison of the figures clearly shows the relaxation effect of the anneal on the shape of the nanowire. In particular, it will be seen that sharp corners and cusps are removed by the anneal. In FIG. 5, the gate oxide is also visible surrounding the silicon nanowire 52, and a portion of the polysilicon gate electrode 54 is also visible.

Of course it might be desired in some cases to maintain sharp features, for example to achieve special effects in the III-V growth. For such purposes, the annealing step may be modified or omitted.

Figure 6:
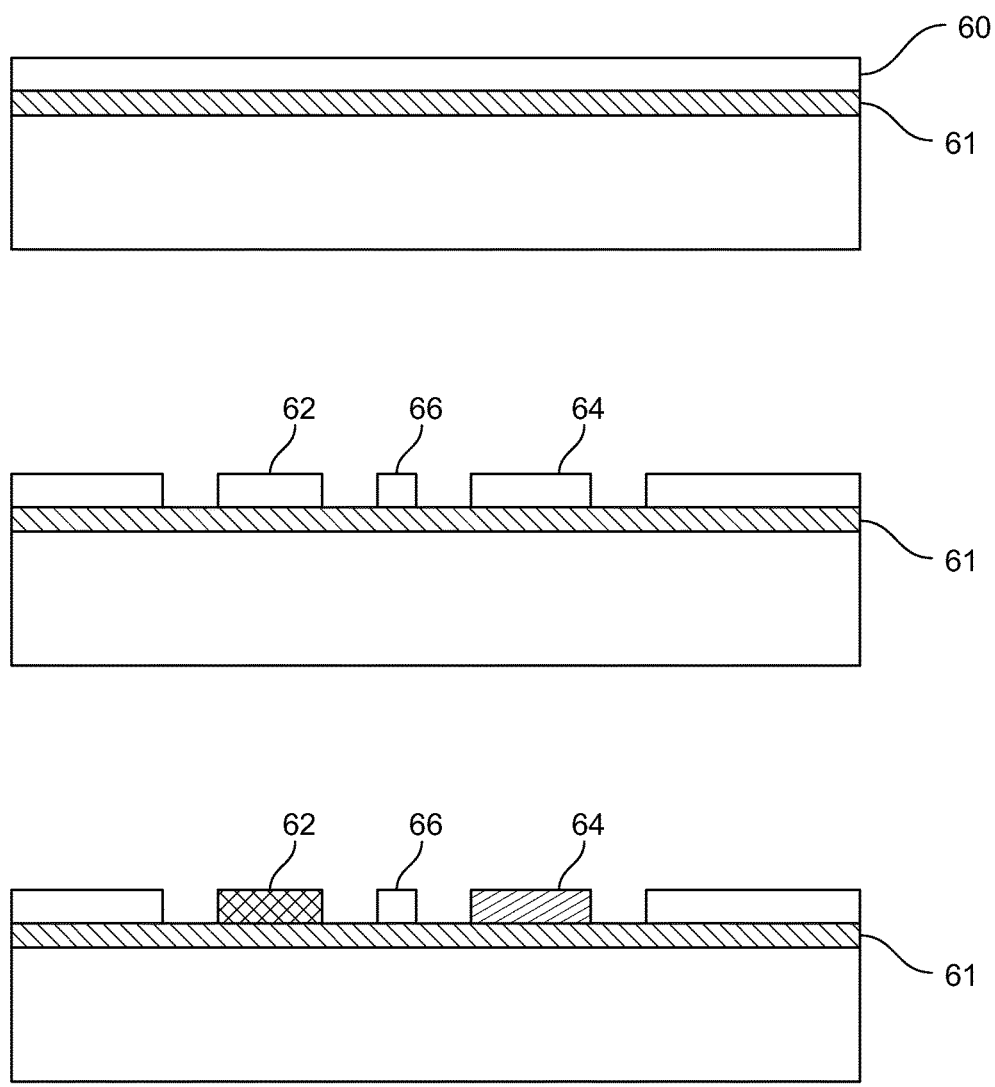
FIGS. 6-9 provide schematic drawings illustrating a succession of stages in the fabrication of a nanowire transistor according to an illustrative process to be described below.

A more detailed description of a process for fabricating a silicon nanowire transistor will now be described with reference to FIGS. 6-9. Common features in these figures will be designated by like reference numerals. As seen in FIG. 6, an initial silicon-on-insulator (SOI) substrate includes silicon device layer 60 and oxide layer 61. The device layer is conventionally patterned to define various islands, including source and drain regions 62, 64, and the nanowire precursor structure 66. The source and drain regions are conventionally doped by ion implantation.

Figure 7:
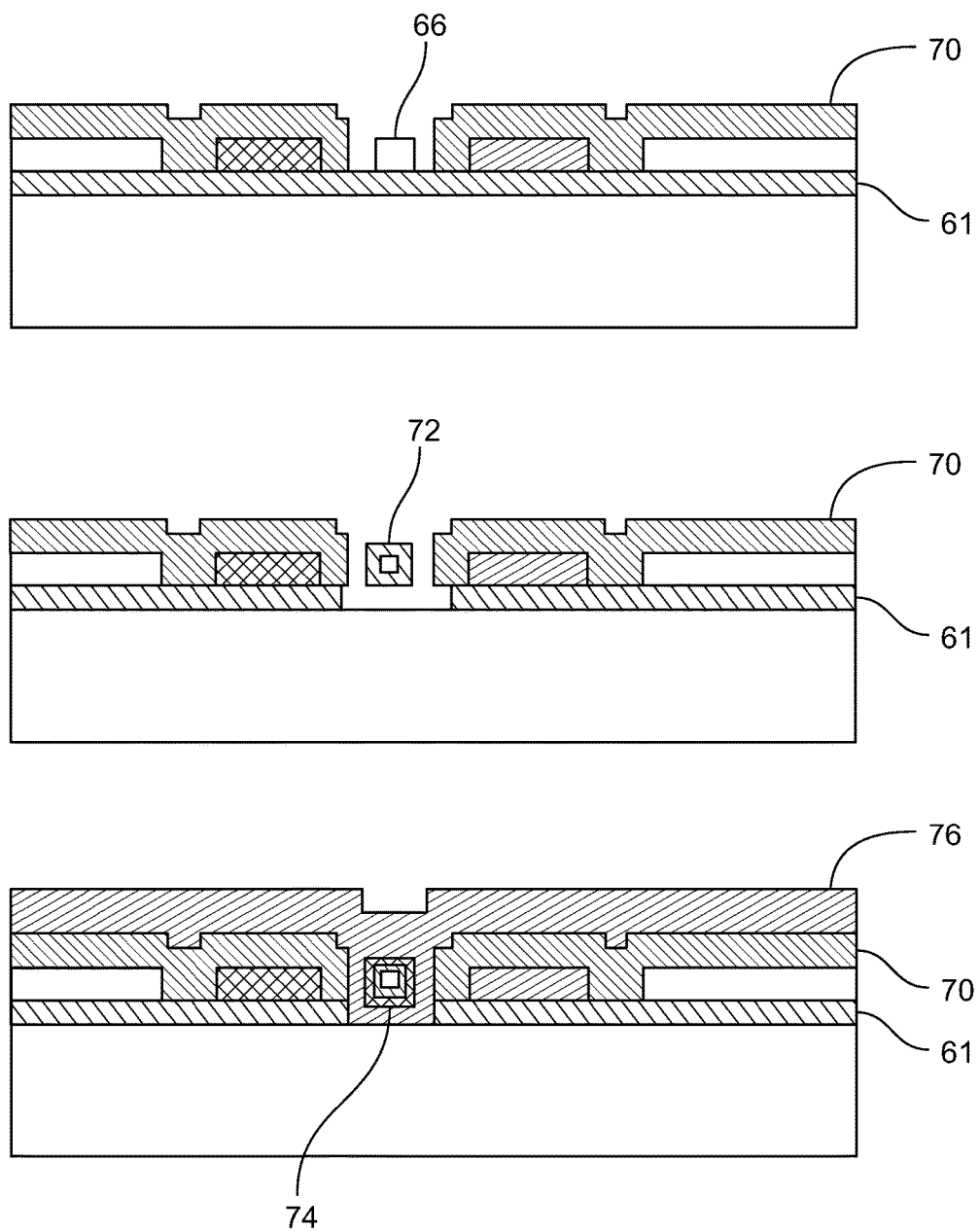

As seen in FIG. 7, an interlayer dielectric layer 70 of silicon nitride is deposited and patterned. The nanowire precursor 66 is undercut by etching the underlying portion of oxide layer 61. Nanowire precursor 66 is then subjected to the oxidize-and-etch cycle described above to reduce its lateral dimensions, and it is then annealed to reshape it and to relieve strain as described above. An all-around gate oxide layer 72 is then grown so as to envelope the nanowire. The gate polysilicon layer 74 is then deposited and pattern so as to envelope the nanowire. An oxide interlayer dielectric layer 76 is then deposited, filling the space around the the nanowire and all-around gate layers and overlying nitride layer 70.

Figure 8:
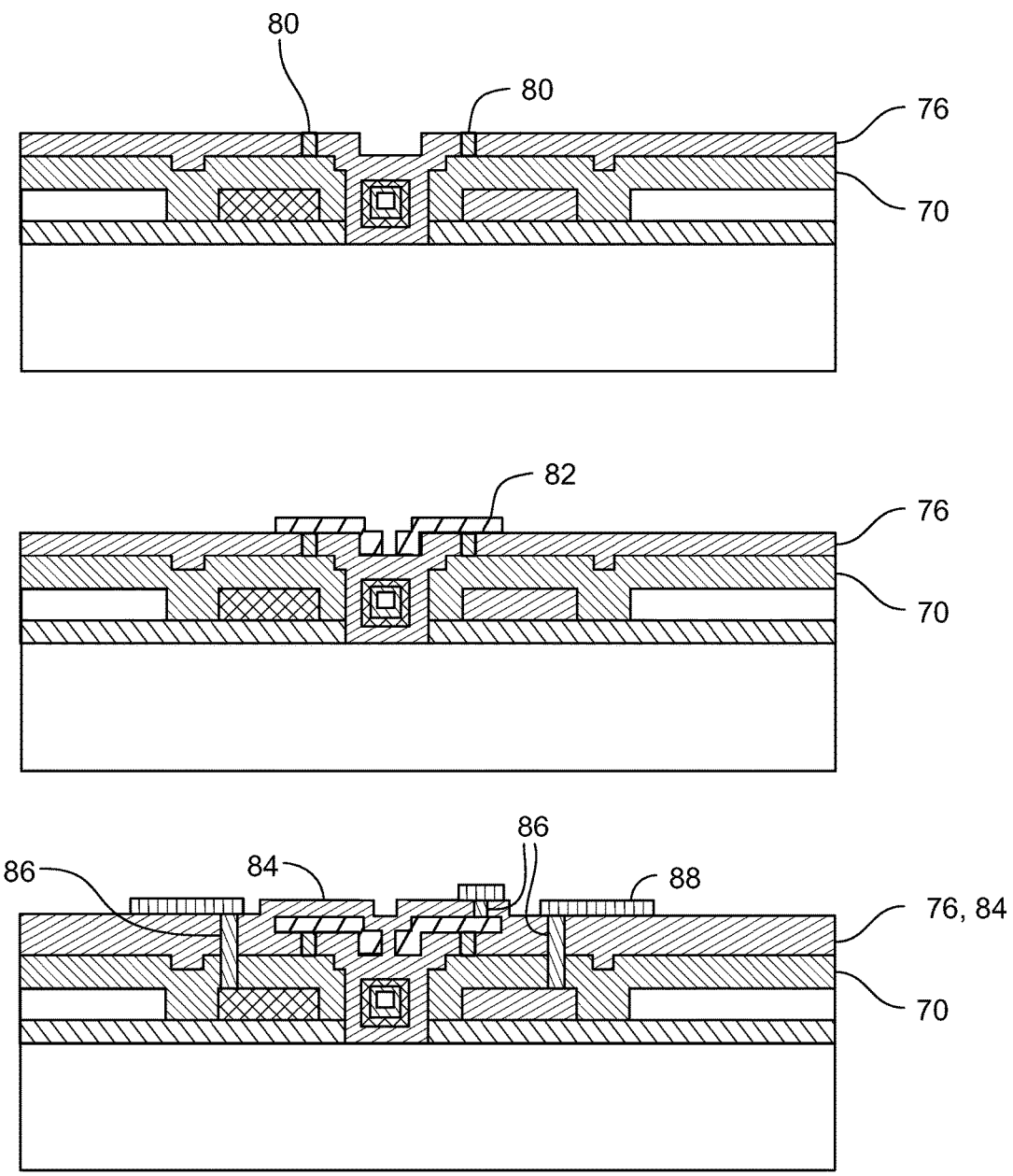

As seen in FIG. 8, oxide layer 76 is patterned and etched, and a further layer of silicon nitride is deposited and etched to form support structures 80. A top gate polysilicon layer 82 is then deposited, patterned, and etched. Oxide interlayer dielectric layer 84 is deposited. Contact holes are then etched down to the source and drain regions, silicide-tungsten contacts 86 are formed, and aluminum contact layer 88 is deposited and patterned to form source and drain contacts.

Figure 9:
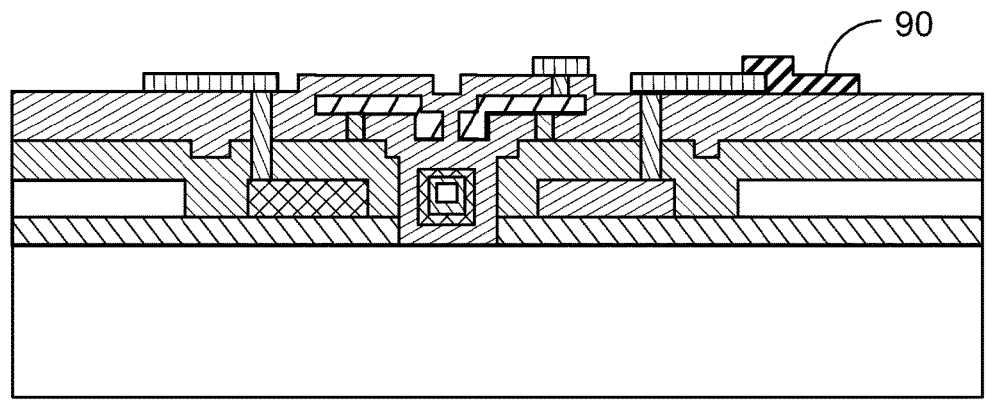
Figure 9:
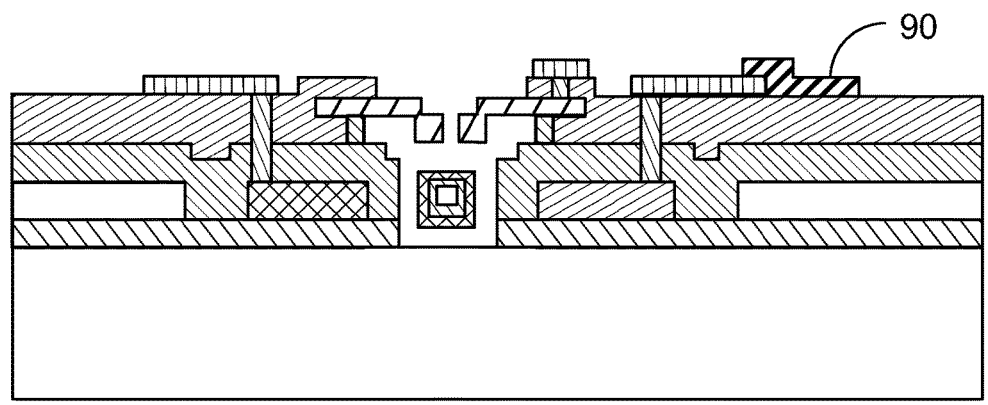

As seen in FIG. 9, platinum contacts 90 are formed in a lift-off process. The oxide lying over and around the nanowire is then etched away to release the nanowire.

Figure 10:
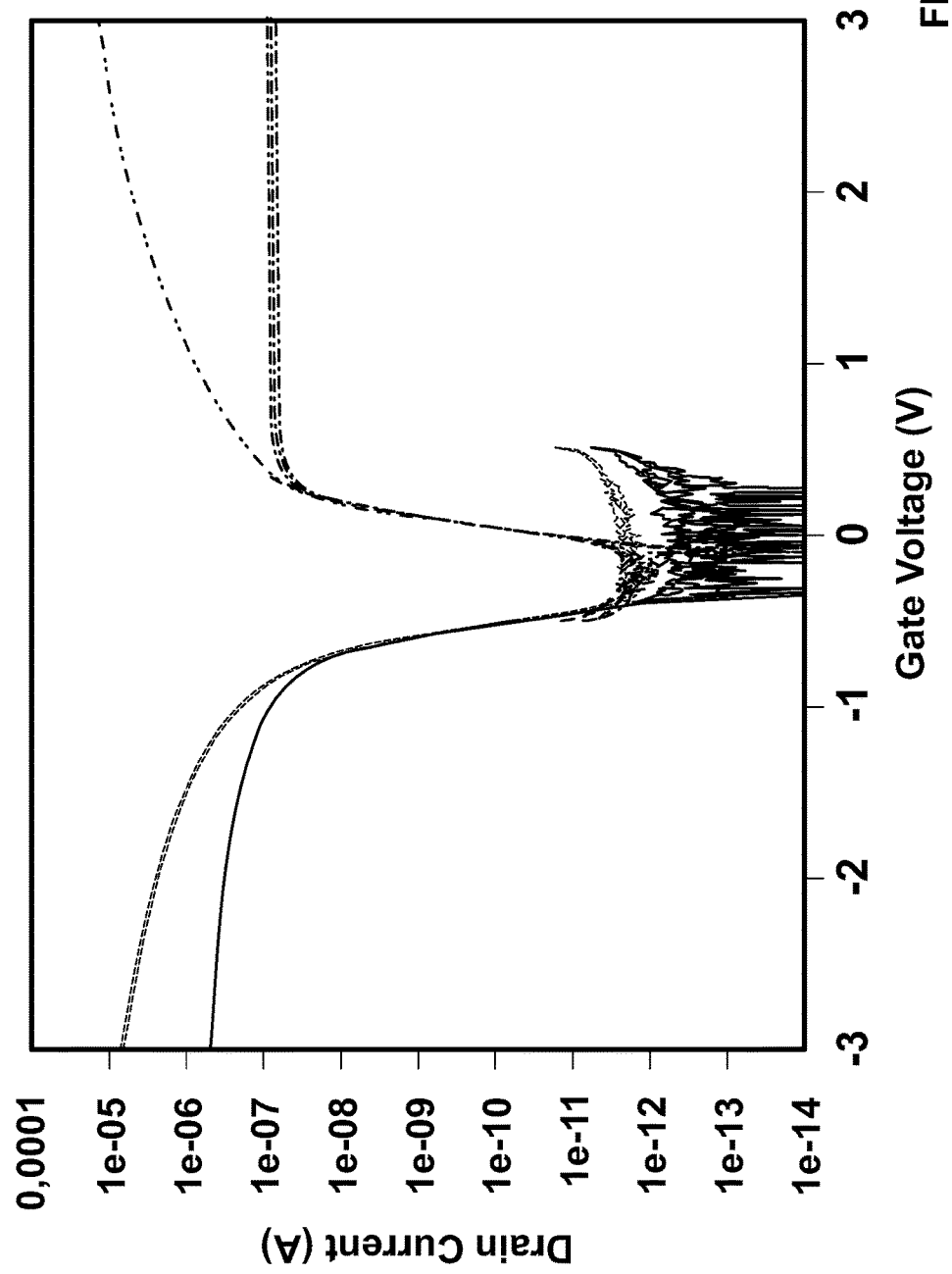
FIG. 10 provides plots of the drain current versus gate voltage for a plurality of fabricated silicon nanowire transistors, taken from across a fabricated wafer. The figure is indicative of the reproduceability that is achievable.

FIG. 10 provides plots of the drain current versus gate voltage for a plurality of fabricated silicon nanowire transistors, taken from across a fabricated wafer. The figure is indicative of the reproduceability that is achievable.

It is noteworthy that a device comprising a silicon nanowire overgrown with a III-V epitaxial structure may be able to integrate both optical and electronic processing functionality. The electronic functionality is provided because the silicon nanowire operates as the channel of a field-effect device. The optical functionality is provided because the silicon nanowire may be clad with an epitaxial layer of III-V material which may be engineered, e.g., to guide, emit, or detect light.

Figure 11:
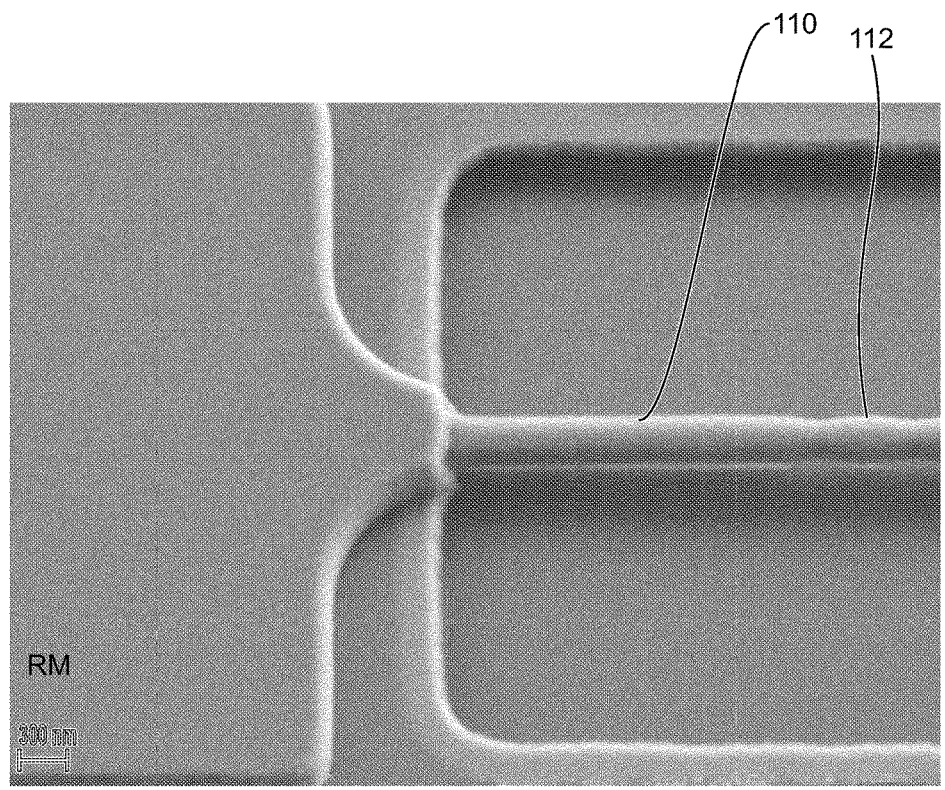
FIG. 11 is an electron micrographic image of a portion of a modified silicon nanowire in which the nanowire has been pinched in several places, i.e. its cross section has been reduced in those places, to provide nodules of silicon that are isolated between thin silicon regions.

FIG. 11 is a view of a modified silicon nanowire 110 in which the nanowire has been pinched, i.e. its cross section has been reduced in those places, to provide nodule 112 of silicon isolated between thin regions that are substantially carrier free or substantially oxidized. Each nodule is thus an isolated charge region, and tunneling is possible between adjacent nodules. We refer to such a modified nanowire as a pinched nanowire or a quantum dot nanowire, particularly when the nodules behave as quantum dots.

One or more nodules can be formed in the nanowire. The nodules are defined in the lithographic patterning of the nanowire, prior to the oxidize-and-etch process that thins the nanowire. Care must be taken to avoid removing so much material that the nanowire loses its integrity in the vicinity of the nodules. However, at the high temperatures we have used for the thinning process, the rate of material removal near the nodules is not significantly different from the rate in other parts of the nanowire.

State changes in the pinched nanowire may be induced by electrical signals, so that the nanowire may function as a memory or as a circuit for performing a particular computational step. Alternatively, state changes could also be induced by a light source or nearby waveguide. Hence, the pinched nanowire could also serve as an optical detector.

The above-described process steps are all front-end CMOS compatible. Moreover, further CMOS processing can be done after the above-described devices are completed, or processing steps can be interleaved to generate the other CMOS devices. Accordingly, the silicon nanowire can be included in a CMOS integrated circuit, and circuit processing can include nanowire fabrication, e.g. as described above, in combination with CMOS processing directed to the completion of an integrated circuit.

For sensor applications, silicon nanowire devices may be formed substantially as described above, and then embedded in an oxide layer throughout the rest of the fabrication process. After the rest of the processing steps are completed, a short release etch can free the nanowire devices to mechanically move and be electrostatically actuated.

Another option, useful for chemical detection, is to remove the gate and insulating oxide layer and allow chemicals to interact with the silicon nanowire directly. Chemicals attached to the surface of the silicon nanowire would alter the surface potential and as a consequence would modulate the conductivity of the channel.

What is claimed is:

1. An electronic device comprising a substrate and an elongate silicon nanowire less than 0.5 µm in cross sectional dimensions, the elongate silicon nanowire being integrally formed with a silicon anchor at each of two ends thereof and having a hexagonal cross-sectional shape, wherein the silicon anchors support the elongate silicon nanowire in a horizontal orientation relative to the substrate, and wherein:
   the substrate comprises a silicon device layer underlain by an oxide layer, the silicon device layer having a vertical span between upper and lower faces thereof;
   the silicon anchors are coextensive with respective portions of the silicon device layer;
   the elongate silicon nanowire is thinner than the silicon device layer, is seamlessly integral with the silicon anchors, and is situated within the vertical span of the silicon device layer;
   the electronic device further comprises at least one first doped source region and at least one first doped drain region defined in the silicon device layer and arranged relative to the elongate silicon nanowire such that a conduction channel between the at least one first doped source region and the at least one first doped drain region passes through the elongate silicon nanowire;
   the elongate silicon nanowire is at least partially enclosed within a wrap-around coating of a gate oxide;
   the wrap-around coating of the gate oxide is at least partially overlain by a polysilicon gate conductor;
   between the silicon anchors, the elongate silicon nanowire is suspended, without further vertical support, above a gap in the oxide layer that underlies the silicon device layer;
   the electronic device further comprises metal contact pads electrically connected to the at least one first doped source region and the at least one first doped drain region through respective interconnects that pass vertically through an interlayer dielectric region; and
   the electronic device further comprises a metal contact pad electrically connected to a top gate polysilicon layer through an interconnect that passes vertically through an interlayer dielectric region, wherein the top gate polysilicon layer is electrically connected to the polysilicon gate conductor.

2. The electronic device of claim 1, wherein the elongate silicon nanowire is conformed with selectively thinned portions that define electrically isolated nodules of silicon.

3. The electronic device of claim 1, wherein the elongate silicon nanowire is included in a Complementary Metal-Oxide-Semiconductor (CMOS) integrated circuit.

4. The electronic device of claim 1, wherein the elongate silicon nanowire is less than 50 nm in cross sectional dimensions.

* * * * *